(12) United States Patent
Hatori (10) Patent No.: US 8,122,408 B2
(45) Date of Patent: Feb. 21, 2012

(54) CIRCUIT VERIFICATION METHOD FOR VERIFYING CIRCUIT WITH TIMING INFORMATION AND LOGIC INFORMATION IN LIBRARY CELL

(75) Inventor: Hirokazu Hatori, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 263 days.

(21) Appl. No.: 12/591,880

(22) Filed: Dec. 3, 2009

(65) Prior Publication Data
US 2010/0146467 A1  Jun. 10, 2010

(30) Foreign Application Priority Data
Dec. 9, 2008  (JP) .................. 2008-313641

(51) Int. Cl.
*G06F 9/455*  (2006.01)
*G06F 17/50*  (2006.01)

(52) U.S. Cl. .......... 716/111; 716/51; 716/104; 716/108; 716/113

(58) Field of Classification Search .............. 716/51, 716/104, 106, 108, 111, 113
See application file for complete search history.

(56) References Cited

U.S. PATENT DOCUMENTS
2009/0055010 A1 * 2/2009 Tanaka .................. 700/110
2010/0115488 A1 * 5/2010 Tanaka .................. 716/12

FOREIGN PATENT DOCUMENTS
JP  2007-140877  6/2007

* cited by examiner

*Primary Examiner* — Nghia Doan
*Assistant Examiner* — Brian Ngo
(74) *Attorney, Agent, or Firm* — McGinn IP Law Group, PLLC (57) ABSTRACT

A circuit verification method propagates a fixed logic value from a black-box circuit block without logic information to a subsequent-stage circuit, by taking into consideration timing information.

8 Claims, 8 Drawing Sheets

FIG. 12

CIRCUIT VERIFICATION METHOD FOR VERIFYING CIRCUIT WITH TIMING INFORMATION AND LOGIC INFORMATION IN LIBRARY CELL

INCORPORATION BY REFERENCE

This application is based upon and claims the benefit of priority from Japanese Patent Application No. 2008-313641 which was filed on Dec. 9, 2008, the disclosure of which is incorporated herein in its entirety by reference.

BACKGROUND OF THE INVENTION

1. Field of the Invention

The present invention relates to a circuit verification method for verifying operation of a circuit, a circuit verification apparatus using the circuit verification method, and a circuit verification program for implementing the circuit verification method on the circuit verification apparatus.

2. Description of Related Art

As information technology equipment become sophisticated in functionality, the integration scales of integrated circuits contained in a single semiconductor device are increasing. Designs of highly-integrated system LSI (Large Scale Integration) and SoC (System On a Chip) semiconductor integrated circuits are often described in a HDL (Hardware Description Language). Because designers do not need to know all specifics of a circuit design in HDL, some circuit blocks are treated as the so-called "black box".

In actual operation of black-box circuit blocks, it is good enough to know which output signal can be obtained in response to which input signal. However, it is necessary to perform simulation at the designing stage to see whether the entire integrated circuit including black-box circuit blocks can achieve a desired operation. In the simulation, data concerning the design of the entire integrated circuit and a library that defines logic information concerning circuit blocks constituting the integrated circuit are used. However, logic information concerning black-box circuit blocks cannot be defined in a library because the logic information is unavailable.

Figure 1:
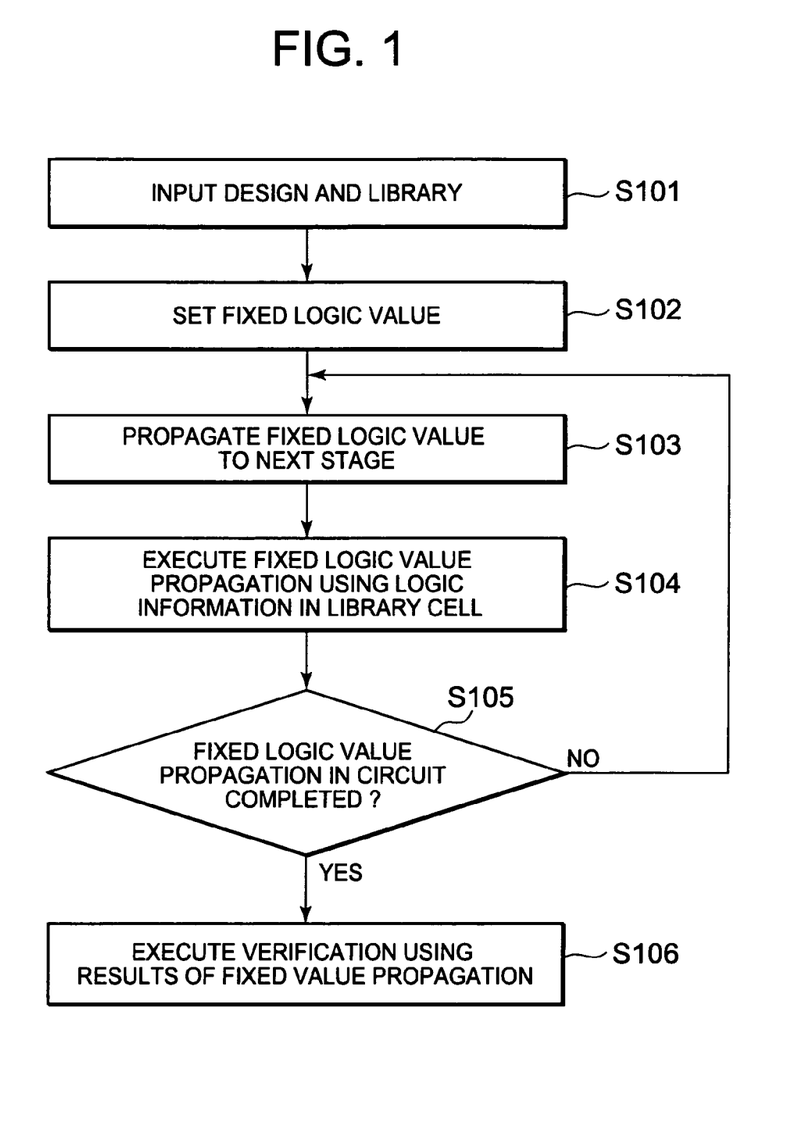
FIG. 1 is a flowchart illustrating a circuit verification method according to a related art.

FIG. 1 is a flowchart illustrating a circuit verification method according to a related art. The flowchart includes the step S101 of inputting a design and a library, step S102 of setting a fixed logic value, step S103 of propagating the fixed logic value to the subsequent stage, step S104 of executing fixed value propagation using logic information in a library cell, step S105 of determining whether or not fixed value propagation in the circuit has been completed, and the S106 of executing verification using the results of the fixed value propagation.

In the flowchart of FIG. 1, step S101 is first executed. After step S101, step S102 is executed. After step S102, step S103 is executed. After step S103, step S104 is executed. After step S104, step S105 is executed. If the result of determination at step S105 is "No", then steps S103 through S105 are executed again. If the result of determination at step S105 is "Yes", then step S106 is executed. Upon completion of step S106, the process of the flowchart of FIG. 1 will end.

The steps of the flowchart of FIG. 1 will be described in detail.

At step S101, design data concerning a design of a circuit to be verified and a library relating to operation are input.

At step S102, a fixed logic value is set as the initial value for the start point in the circuit to be verified. The start point in the circuit to be verified is a given node in the circuit to be verified, which may be an external input terminal, for example, of the entire circuit to be verified.

At step S103, the design data is traced from the set start point to select the next-stage circuit block to which the fixed logic value is to be propagated.

At step S104, the fixed logic value of the input signal is propagated to an output signal in the selected circuit block on the basis of logic information defined in the library. After the fixed logic value has been propagated, a new circuit block to which the output signal of the selected circuit block is to be input, that is, a subsequent-stage circuit block, is selected.

At step S105, determination is made as to whether or not possible fixed logic value propagation has been performed in all circuit blocks of the entire circuit to be verified.

At step S106, the propagated fixed logic value is used to perform various kinds of verifications on the circuit to be verified.

Relating to the foregoing, Patent Document (Japanese Patent Application Laid-Open No. 2007-140877) discloses a logical equivalence verification system. The logical equivalence verification system described in Patent Document includes an RTL (Register Transfer Level)/gate level circuit description, a library, and a logical equivalence verification unit. The RTL/gate level circuit description includes RTL circuit description information and gate level description information. The library includes information for executing logical equivalence verification. The logical equivalence verification unit includes a compiler, a verification circuit database, a logical equivalence verification processing unit, and black-box cell transforming means. The compiler generates a circuit database from the RTL/gate level circuit description information and the library information. The circuit verification database generates a reference circuit database for generating reference circuit information from information output from the compiler and verification circuit information from information output from the compiler. The logical equivalence verification processing unit executes verification processing based on information output from the reference circuit database and the verification circuit database. The black box cell transforming means provides a given logic to a black box cell to transform the black box cell to a function cell.

SUMMARY

As has been described above, for verification of circuit operation, a fixed logic value can be propagated from a circuit block to a subsequent-stage circuit block if an output signal from each individual circuit block can be expressed by a logical expression based on an input signal. The man-hours and processing time required for verifying a circuit can be reduced by propagating the fixed logic value from a circuit block to a subsequent-stage circuit block in sequence. However, it was impossible to propagate a fixed logic value from a black-box circuit block without logic information to a subsequent stage.

A circuit verification method of an exemplary aspect includes: (a) inputting design data relating to a design of a circuit to be verified and a library relating to operation of the circuit to be verified, the library including logic information concerning the circuit to be verified and timing information concerning the circuit to be verified; (b) setting a fixed logic value for a predetermined node in the circuit to be verified as an initial value; (c) tracing the design data from the node for which the fixed logic value is set to select a next-stage circuit block to which the fixed logic value is to be propagated; (d) propagating the fixed logic value from an input to an output in the circuit block selected at step (c); (e) determining whether or not executable fixed logic value propagation has been completed in all circuit blocks and repeating steps (c) and (d) until the propagation has been completed; (f) if the executable fixed logic value propagation has been completed in all blocks, executing verification of the entire circuit to be verified by using results of the fixed logical value propagation performed by a logic information propagating unit and a timing information propagating unit; step (d) comprising the steps of: (d-1) determining whether or not logic information is defined in a library of the circuit block selected at step (c); (d-2) if the logic information is defined in the library, propagating the fixed logic value from an input of the circuit block to an output of the circuit block on the basis of the logic information; and (d-3) if the logic information is not defined in the library, propagating the fixed logic value from the input of the circuit block to the output of the circuit block on the basis of timing information.

A circuit verification apparatus according to an exemplary aspect includes an input unit, a design storage, a logic information storage, a timing information storage, a fixed logic value setting unit, a next-stage circuit block selecting unit, a library checking unit, a logic information propagating unit, a timing information propagating unit, a propagation completion determining unit, and a verification executing unit. The input unit is used for inputting design data concerning a design of a circuit to be verified and a library relating to operation of the circuit to be verified. The design storage is used for storing design data. The logic information storage is used for storing logic information for the circuit to be verified, contained in a library. The timing information storage is used for storing timing information for the circuit to be verified, contained in the library. The fixed logic value setting unit sets a fixed logic value, which is an initial value, for a given node in the circuit to be verified. The next-stage circuit block selecting unit traces design data from the node for which the fixed logic value is set to select a next-stage circuit block to which the fixed logic value is to be propagated. The library checking unit determines whether or not logic information is defined in a library for the circuit block selected by the next-stage circuit block selecting unit. The logic information propagating unit propagates a fixed logic value from an input to an output of the circuit block on the basis of logic information if the logic information is defined in the library. The timing information propagating unit propagates the fixed logic value from the input to the output of the circuit block on the basis of timing information if logic information is not defined in the library. The propagation completion determining unit determines whether or not executable fixed logic value propagation has been completed in all circuit blocks. The verification executing unit executes verification of the entire circuit to be verified by using the results of fixed logic value propagation performed by the logic information propagating unit and the timing information propagating unit when the executable fixed logic value propagation has been completed in all circuit blocks.

A circuit verification method, a circuit verification apparatus, and a circuit verification program of the present invention enable a fixed logic value to be propagated from a black-box circuit block without logic information to a subsequent-stage circuit by taking into consideration timing information.

BRIEF DESCRIPTION OF THE DRAWINGS

The above and other exemplary aspects, advantages and features of the present invention will be more apparent from the following description of certain exemplary embodiments taken in conjunction with the accompanying drawings, in which.

DETAILED DESCRIPTION OF THE EXEMPLARY EMBODIMENTS

Figure 11:
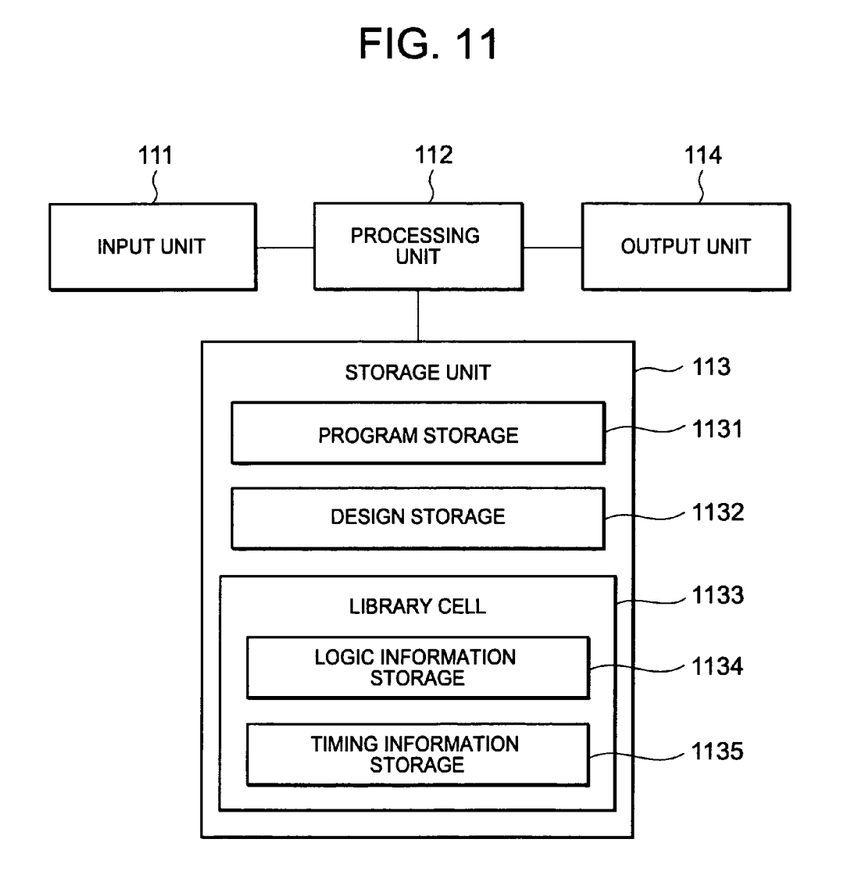
FIG. 11 is a block diagram illustrating a configuration of a circuit verification apparatus according to the present invention.

FIG. 11 is a block diagram illustrating a configuration of a circuit verification apparatus according to an exemplary embodiment of the present invention. The circuit verification apparatus may be implemented using a computer including an input unit 111, a processing unit 112, a storage unit 113, and an output unit 114. The storage unit 113 includes a program storage 1131, a design storage 1132, and a library cell 1133. The library cell 1133 includes a logic information storage 1134 and a timing information storage 1135.

The input unit 111 is connected to the processing unit 112. The processing unit 112 is connected to the storage unit 113 and the output unit 114.

The storage unit 113 is used for storing programs, designs, logic information, timing information and other information.

The program storage 1131 is used for storing a circuit verification program according to the present invention.

The design storage 1132 is used for storing design data concerning a design of a circuit to be verified. The design of the circuit to be verified includes information about circuit blocks constituting the circuit to be verified and connections between the circuit blocks.

The library cell 1133 is used for storing library information concerning operation of the circuit to be verified. The library information includes logic information and timing information.

The logic information storage is used for storing logic information out of library information. The logic information is a logical expression of an output signal, based on an input signal, in each individual circuit block. Not all circuit blocks have logic information. In particular, logic information for a circuit block whose internal structure is a black box cannot be provided.

Timing information is used for storing timing information out of library information. The timing information includes information such as the amount of delay between an input signal and an output signal, possible combinations of logic values, and constraint conditions for each circuit block. These items of timing information can be considered a set of timing arcs representing the relationship between one input signal and one output signal.

The input unit 111 is used for inputting the circuit verification program, a design of a circuit to be verified, library information for the circuit to be verified, logic information, timing information and the like from an external source. If any or all of these items of information are already stored in the storage unit 113, then they do not need to be input in addition.

The processing unit 112 executes the circuit verification program using a design of a circuit to be verified, logic information, timing information.

The output unit 114 outputs the result of processing by the processing unit 112 to the outside. The result of processing by the processing unit 112 may be stored in the storage unit 113.

The circuit verification apparatus described herein is illustrative only and is not limited to the configuration described above. Any other configuration may be used that is capable of implementing the same functions.

Figure 2:
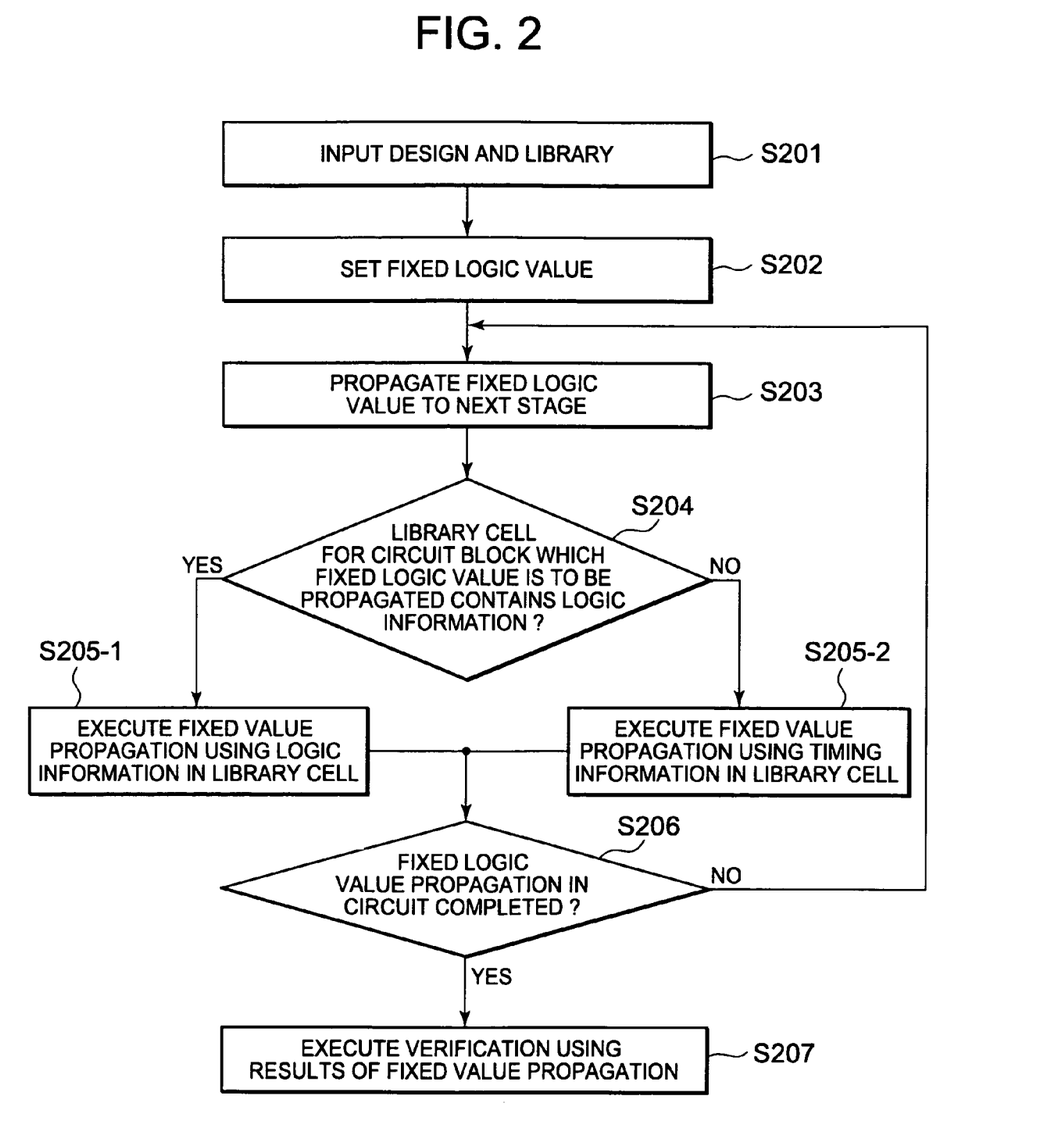
FIG. 2 is a flowchart illustrating a circuit verification method according to an exemplary embodiment of the present invention.

FIG. 2 is a flowchart illustrating a circuit verification method according to an exemplary embodiment of the present invention. The flowchart includes step S201 of inputting a design and a library, step S202 of setting a fixed logic value, step S203 of propagating the fixed logic value to a next-stage, step S204 of determining whether there is logic information in a library cell for a circuit block to which the fixed logic value is to be propagated, step S205-1 of executing fixed value propagation using logic information in the library cell, step S205-2 of executing fixed value propagation using timing information in the library cell, step S206 of determining whether fixed value propagation in the circuit has been completed, and step S207 of executing verification using the results of the fixed value propagation.

In the flowchart of FIG. 2, step S201 is executed first. After step S201, step S202 is executed. After step S202, step S203 is executed. After step S203, step S204 is executed. If the result of determination at step S204 is "Yes", then step S205-1 is executed. If the result of determination at step S204 is "No", then step S205-2 is executed. After step S205-1 or S205-2, step S206 is executed. If the result of determination at step S206 is "No", then steps S203 through S206 are executed again. If the result of determination at step S206 is "Yes", then step S207 is executed. Upon completion of step S207, the process in the flowchart of FIG. 2 will end.

The steps of the flowchart of FIG. 2 will be described in detail.

At step S201, a design and a library of a circuit to be verified are input.

At step S202, a fixed logic value for the start point in the circuit to be verified is set. Verification of the circuit is performed circuit-block by circuit-block, proceeding toward subsequent-stages as described later. Accordingly, verification is preferably started at an input of the foremost-stage circuit block. The start point in the circuit to be verified is any node included in the circuit to be verified for setting an initial value used for verification. For example, the start point may be an external input terminal of the circuit to be verified.

At step S203, the design is traced from the set start point to select a subsequent-stage circuit block to which the fixed logic value is to be propagated.

At step S204, the library for the circuit block selected at step S203 is referred to. If logic information is defined in the library, then the process proceeds to step S205-1. If logic information is not defined in the library, then the process proceeds to step S205-2.

At step S205-1, the fixed logic value of an input signal is propagated to an output signal of the selected circuit block on the basis of the logic information defined in the library. After the fixed logic value has been propagated, a new circuit block to which the output signal of the selected circuit block is to be input, that is, a subsequent-stage circuit block, is selected.

At step S205-2, the fixed logic value of an input signal is propagated to an output signal of the selected circuit block on the basis of the timing information defined in the library. A specific method of the propagation will be detailed later. After the fixed logic value has been propagated, a new circuit block to which the output signal of the selected circuit block is to be input, that is, a subsequent-stage circuit block, is selected.

At step S206, determination is made as to whether possible fixed logic value propagation has been performed in all circuit locks in the entire circuit to be verified.

At step S207, the propagated fixed logic value is used to perform various verification of the circuit to be verified.

Figure 12:
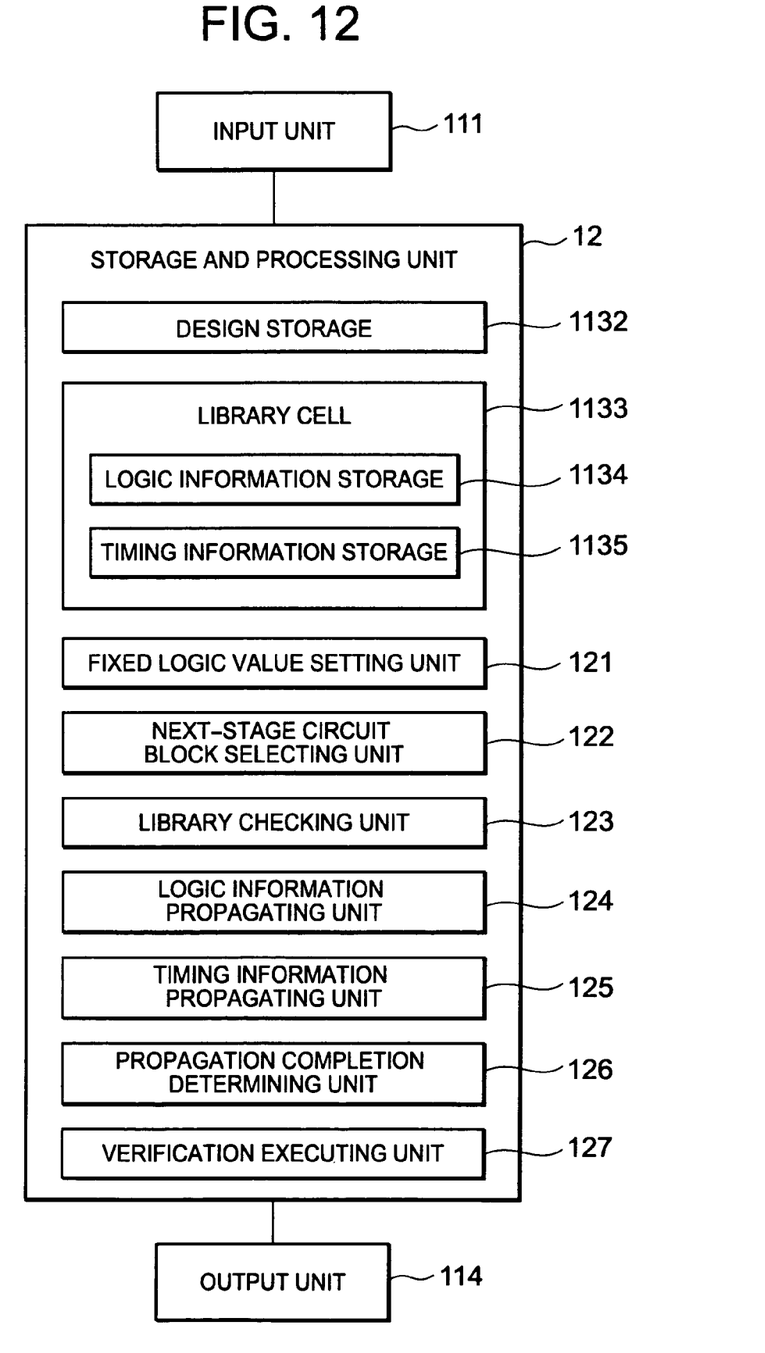
FIG. 12 is a block diagram illustrating a configuration of a circuit verification apparatus according to the present invention by using functional blocks.

FIG. 12 is a block diagram illustrating a configuration of a circuit verification apparatus according to the present invention with respect to functional blocks. It will be explained that the function blocks capable of executing the steps in FIG. 2 are implemented by using the processing unit and the storage unit in FIG. 11. The same components in FIG. 12 as those in FIG. 11 will be described using the same reference numerals.

The circuit verification apparatus includes an input unit 111, a storage and processing unit 12, and an output unit 114 as functional blocks. The storage and processing unit 12 includes a design storage 1132, a library cell 1133, a fixed logic value setting unit 121, a next-stage circuit block selecting unit 122, a library checking unit 123, a logic information propagating unit 124, a timing information propagating unit 125, a propagation completion determining unit 126, and a verification executing unit 127. The library cell 1133 includes a logic information storage 1134 and a timing information storage 1135.

The storage and processing unit 12 is connected to the input unit 111 and the output unit 114. It can be considered that the functional blocks included in the storage and processing unit 12 are in effect the processing unit 112 and the storage unit 113 which are interconnected. Therefore, description of the interconnections will be omitted.

The input unit 111 is a functional block for executing step S201. A design and a library input at step S201 are stored in the design storage 1132 and the library cell 1133, respectively. Logic information and timing information in the library input at step S201 are stored in the logic information storage 1134 and the timing information storage 1135, respectively.

The fixed logic value setting unit 121 is a functional block for executing step S202.

The next-stage circuit block selecting unit 122 is a functional block for executing step S203.

The library checking unit 123 is a functional block for executing step S204.

The logic information propagating unit 124 is a functional block for executing step S205-1.

The timing information propagating unit 125 is a functional block for executing step S205-2.

The propagation completion determining unit 126 is a functional block for executing step S206.

The verification executing unit 127 is a functional block for executing step S207. Results of step S207 are output through the output unit 114 to the outside.

Steps S201 through S203 and steps S205-1, S206, and S207 described above are the same as steps S101 through S103 and steps S104, S105, and S106 described in the flowchart of FIG. 1 as the related art. That is, the circuit verification method according to the present invention can be considered the related-art method described with reference to FIG. 1 to which the step S204 of selecting a black-box circuit block for which logic information is not available and the step S205-2 of attempting to propagate a fixed logic value in the black-box circuit block by using timing information alone are added.

What is important in the circuit verification method according to the exemplary embodiment is to propagate a fixed logic value. The verification at step S207 may be the related verification and therefore detailed description of the verification will be omitted.

Here, step S205-2 will be described in detail. Since a fixed logic value propagates differently in different types of black-box circuits to be verified, exemplary embodiments will be described below with respect to different types of black-box circuits.

First Exemplary Embodiment

An exemplary embodiment will be described with respect to a first type of black-box circuit to be verified in which there is a timing arc from only one input signal to an output signal.

TABLE 1

| Input-transition-output-transition combination | Fixed value propagation operation |
|---|---|
| Rise-Rise, Fall-Fall | Input signal is propagated without change |
| Rise-Fall, Fall-Rise | Inverted input signal is propagated |
| Rise-Rise only | 1 is propagated only if input signal is 1 |
| Fall-Rise only | 0 is propagated only if input signal is 0 |
| Rise-Fall only | 0 is propagated only if input signal is 1 |
| Fall-Rise only | 1 is propagated only if input signal is 0 |

Table 1 illustrates a relationship between input-transition-output-transition combination and fixed value propagation. Here, "Rise" means transition from 0 to 1 and "Fall" means transition from 1 to 0.

For example, "Rise-Rise" on the first row means that when the input signal transitions from 0 to 1, the output signal also transitions from 0 to 1. Similarly, "Fall-Fall" means that when the input signal transitions from 1 to 0, the output signal also transitions from 1 to 0. That is, fixed logic propagation operation corresponding to the first row represents that the value of the input signal is propagated as the output signal without change.

"Rise-Fall" on the second row means that when the input signal transitions from 0 to 1, the output signal transitions 1 to 0. Similarly, "Fall-Rise" means that when the input signal transitions from 1 to 0, the output signal transitions 0 to 1. That is, the fixed logic propagation operation corresponding to the second row represents that the value of the input signal is inverted and propagated as the output signal.

Figure 3:
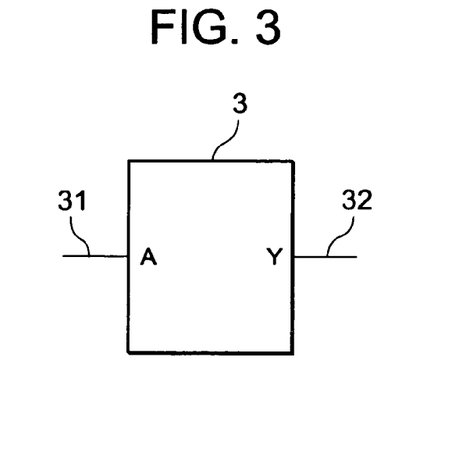
FIG. 3 is a schematic diagram illustrating a one-input one-output black-box circuit.

FIG. 3 is a schematic diagram illustrating a one-input, one-output black-box circuit 3. The black-box circuit 3 includes an input 31 and an output 32.

The black-box circuit 3 outputs an output signal Y through the output 32 on the basis of the value of an input signal A provided to the input 31.

If the black-box circuit 3 has combinations of timing arcs as illustrated on the first row of Table 1, then the value of output signal Y is fixed at "0" when the value of input signal A is fixed at "0". Similarly, when the value of input signal A is fixed at "1", the value of output signal Y is fixed at "1".

Second Exemplary Embodiment

An exemplary embodiment will be described with respect to a second type of black-box circuit to be verified in which there are timing arcs from a plurality of input signals to an output signal.

If there are timing arcs from a plurality of input signals, then there is the possibility that values determined by fixed value propagation for the individual timing arcs are not identical. If this is the case, then the final value cannot be determined. Therefore, the following conditional judgment operation is performed in addition to the processing performed for one-input, one-output circuits. That is, a fixed value is propagated through each of the plurality of timing arcs by taking into consideration a condition under which the timing arc becomes valid. The condition is hereinafter referred to as "activation condition".

Fixed value propagation is performed in accordance with the following five rules. A first rule is that a plurality of timing arcs are processed individually to determine the value of output signal Y. However, if the value of output signal Y is determined to be neither 0 nor 1, then it is treated as an undetermined value "X".

A second rule is that if it is determined that the value of the output signal Y is the same for all of the plurality of timing arcs as a result of applying the first rule and the value is "0" or "1", then the value is propagated as the output signal Y.

A third rule is that if the value of output signal Y is undetermined as a result of applying the first rule, then attention is paid only on the timing arcs with valid activation conditions. If the output signal Y takes the same value "0" or "1" for all of those timing arcs, then the value is propagated as output signal Y.

A fourth rule is that if a state other than the states described above is obtained as a result of applying the first rule, then the value of output signal Y is considered undetermined.

A fifth rule is that if the first rule is not applicable, that is, if any of input signal values are an undetermined value "X", then the second to fourth rules are applied to all possible combinations of instances where the undetermined input signal is "0" and where the undetermined input signal is "1". If as a result the value of the output signal Y is determined to be the same value "0" or "1" for all combinations, then the value is propagated as the output signal Y. On the other hand, if the value of the output signal Y is not the same, then an undetermined value "X" is propagated as the output signal Y.

Figure 4:
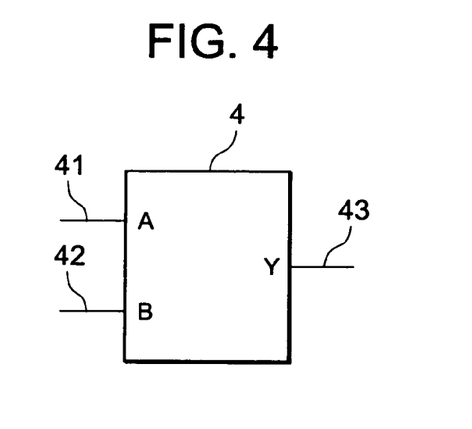
FIG. 4 is a schematic diagram illustrating two-input one-output black-box circuit.

FIG. 4 is a schematic diagram illustrating a two-input, one-output black-box circuit 4. The black-box 4 includes a first input 41, a second input 42, and an output 43.

The black-box circuit 4 outputs an output signal Y through the output 43 on the basis of a first input signal A provided through the first input 41 and a second input signal B provided through the second input 42.

An example will be described below. A first timing arc relating to the first input signal A and the output signal Y has the combination of Rise-Rise, Fall-Fall, and the activation condition "B=1". A timing arc B relating to the second input signal B and the output signal Y has the combination of Rise-Rise, Fall-Fall, and the activation condition "A=1".

Details of the activation conditions will be described. The activation condition "B=1" for the first timing arc means that if the second input signal B=1, Rise-Rise and Fall-Fall become valid. On the other hand, if the second input signal B=0, then both of the Rise-Rise and Fall-Fall relationships between the first input signal A and the output signal Y are invalidated.

Here, specific values are assigned to the first input signal A and the second input signal B and each case will be described.

A first case will be described in which the first input signal A=0 and the second input signal B=0. When the first rule is applied, the output signal Y=0 is obtained in both first and second timing arcs. Here, the second rule is applied and "0" is propagated as output signal Y.

A second case will be described in which the first input signal A=0 and the second input signal B=1. When the first rule is applied, the output signal Y=0 in the first timing arc and the output signal Y=1 in the second timing arc. Because the second rule cannot be applied, the third rule is applied. The activation condition for the first timing arc is valid and the activation condition for the second timing arc is invalid. Accordingly, "0" obtained in the first timing arc is propagated as the value of the output signal Y.

A third case will be described in which the first input signal A=undetermined value "X" and the second input signal B=0. Because the first rule is not applicable, the fifth rule is applied. Assuming that first input signal A=0, the output signal Y=0 is obtained in accordance with the second rule. Assuming that the first input signal B=1, the output signal Y=0 is obtained in accordance with the third rule. Both when the first input signal A is "1" and when the first input signal A is "0", the value of the output signal Y "0" is obtained. Therefore, "0" is propagated as the value of the output signal Y in accordance with the fifth rule.

Third Exemplary Embodiment

An exemplary embodiment will be described with respect to a third type of black-box circuit to be verified in which a timing arc includes a transition to a HiZ (high-impedance) state.

A case is considered where a timing arc of a black-box circuit to be verified includes transition to the HiZ state. In this case, the input signal of the timing arc is considered to be an enable signal for a tristate buffer and processing is performed in accordance with the following rules.

A first rule is that when the input signal is fixed to the side on which a transition from the HiZ state to a determined value occurs, the enable signal for the tristate buffer is assumed to be in the On state and fixed value propagation is performed through another timing arc.

A second rule is that when the input signal is fixed to the side on which transition from a determined value to the HiZ state occurs, the enable signal for the tristate buffer is assumed to be in the Off state and the output signal is placed in the Hiz state.

A third rule is that when neither of the first and second rules is applicable, fixed value propagation processing is not performed and the output signal is placed in an undetermined state "X". This is done because the enable signal for the tristate buffer can be turned off.

Figure 5:
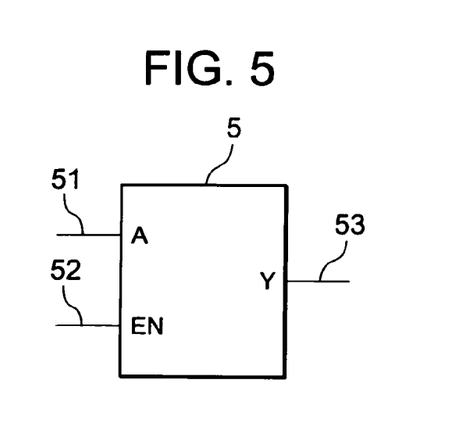
FIG. 5 is a schematic diagram illustrating a black-box circuit having a timing arc including a transition to a HiZ state.

FIG. 5 is a schematic diagram illustrating a black-box circuit 5 having a timing arc including a transition to the HiZ state. The black-box circuit 5 includes a first signal input 51, a second signal input 52, and a signal output 53.

The black-box circuit 5 outputs an output signal Y through the signal output 53 on the basis of a first input signal A provided through the first signal input 51 and a second input signal EN provided through the second signal input 52.

An example will be described below. A first timing arc relating to the first input signal A and the output signal Y has the combination of Rise-Rise and Fall-Fall. A second timing arc relating to the second input signal EN and the output signal Y has the combination of Rise-ZH, Rise-ZL, Fall-Hz and Fall-LZ. Here, ZH, ZL, HZ, and LZ correspond to a transition from the HiZ state to the determined value "1", a transition from the HiZ state to the determined value "0", a transition from the determined value "1" to the HiZ state, and a transition from the determined value "0" to the HiZ state, respectively.

Here, each case in which the second timing arc relating to the second input signal EN includes a transition to the HiZ state will be considered with a specific fixed value being set for the second input signal EN.

A first case will be described in which the second input signal EN=0. The second input signal EN is fixed at 0. This is a state after a Fall operation of the second input signal EN has been completed. According to the second timing arc, at the time Fall operation of the second input signal EN has been completed, the output signal Y should complete a transition from the determined value "1" or "0" to the HiZ state. In either case, the second input signal EN is fixed to the side on which the output signal Y transitions to the HiZ state. Accordingly, the second rule is applied to set the output signal Y to the HiZ state.

A second case will be described in which the second input signal EN=1. The second input signal EN is fixed at 1. This is a state after a Rise operation of the second input signal EN has been completed. According to the second timing arc, when the second input signal EN has completed Rise, the output signal Y should complete a transition from the HiZ state to the determined value "0" or "1". In either case, the second input signal EN is fixed to the side on which the output signal Y transitions form the HiZ state. Accordingly, the first rule is applied and fixed value propagation is performed using another timing arc. That is, the value of the output signal Y that is determined by the first timing arc is propagated.

Fourth Exemplary Embodiment

An exemplary embodiment will be described with respect to a fourth type of black-box circuit to be verified in which an input signal has a clock attribute.

TABLE 2

| Situation of other timing arc(s) | Fixed logic propagation |
|---|---|
| There are no other timing arcs | Fixed value is not propagated |
| There is asynchronous set/reset timing arc | Fixed value is propagated for asynchronous set/reset timing arc |
| There is timing arc other than asynchronous set/reset | If value is fixed to the side on which transition occurs due to clock, logic propagation of fixed value is performed for that timing arc |

Table 2 illustrates processing performed according to the situation of other timing arc(s) when an input signal has a clock attribute.

As listed in Table 2, if an input signal has a clock attribute, then the following three rules are applied and fixed logic value propagation is performed.

A first rule is that if there is not a timing arc besides the timing arc relating to the input signal having a clock attribute, fixed logic value propagation is not performed. In this case, the output signal takes an undetermined value "X".

A second rule is that if there is a timing arc relating to asynchronous set/reset in addition to a timing arc relating to the input signal having a clock attribute, fixed logic value propagation is performed in accordance with the timing arc relating to the asynchronous set/reset.

A third rule is that if there is a timing arc that does not relate to asynchronous set/reset besides a timing arc relating to the input signal having a clock attribute and the value of the input signal relating to the former timing arc is fixed to the direction in which transition occurs due to the clock, fixed logic value propagation is performed in accordance with the latter timing arc.

Figure 6:
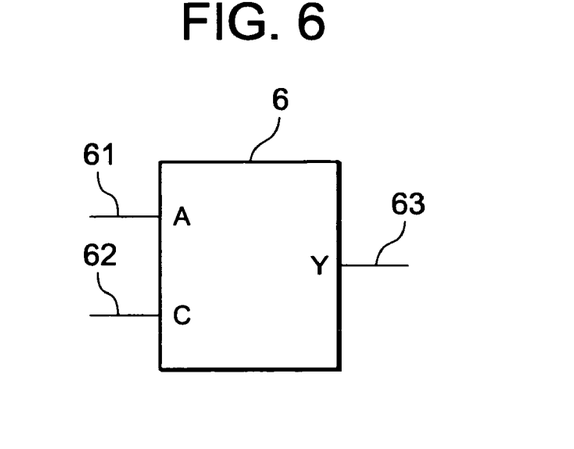
FIG. 6 is a schematic diagram illustrating a black-box circuit including a clock attribute terminal.

FIG. 6 is a schematic diagram illustrating a black-box circuit 6 including a clock attribute terminal. The black-box circuit 6 includes a first input 61, a second input 62, and an output 63.

The black-box circuit 6 outputs an output signal Y through the output 63 on the basis of the value of a first input signal A provided to the first input 61 and the value of a second input signal C provided to the second input 62.

Cases where a clock attribute is added to the second input signal C provided through the second input 62 of the black-box circuit 6 will be described.

A first case will be considered in which the black-box circuit 6 has the following timing arcs. A first timing arc relates to the second input signal C and the output signal Y and specifically has the combination of Rise-Rise and Rise-Fall. There is no timing arc that relates to the first input signal A and the output signal Y.

Since there is not a timing arc other than the timing arc relating to the clock attribute in this case, the first rule is applied to this case. Consequently, fixed value propagation is not performed. In other words, it is considered that the black-box circuit 6 does not operate if the second input signal C is fixed.

A second case will be considered in which the black-box circuit 6 has the following timing arcs. A first timing arc relates to the first input signal A and the output signal Y and specifically has the combination of Rise-Rise and Fall-Fall. A second timing arc relates to the second input signal C and the output signal Y and specifically has the combination of Rise-Rise and Rise-Fall.

In this case, there is the first timing arc that does not relate to asynchronous set/reset in addition to the second timing arc that relates to the input signal having the clock attribute. The value of the second input signal C relating to the second timing arc is fixed at 1. That is, the value of the second input signal C is fixed in a direction in which a transition occurs due to the clock. Consequently, the third rule is applied to the case and fixed value propagation is performed using the first timing arc.

Fifth Exemplary Embodiment

The first to fourth exemplary embodiments of the present invention have been described. The four types of black-box circuits 3 to 6 used are simple models specialized for specific functions, for purposes of illustration of the concept of fixed logic propagation operation. However, black-box circuits for which logic models cannot actually be described cannot be simplified as these. Application of the present invention to a black-box circuit having such a complex logic will be described below.

Figure 7:
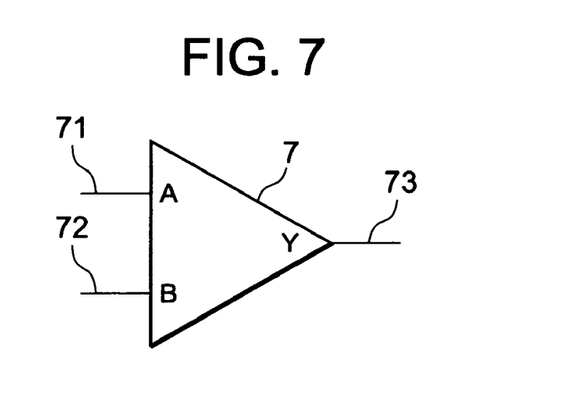
FIG. 7 is a schematic diagram illustrating a differential input buffer circuit.

A differential input buffer will be described by way of example. FIG. 7 is a schematic diagram illustrating a differential input buffer 7. The differential input buffer 7 includes a first input 71, a second input 72, and an output 73.

The differential input buffer 7 outputs an output signal Y through the output 73 on the basis of the value of a first input signal A provided through the first input 71 and the value of a second input signal B provided through the second input 72.

It is a prerequisite to correct operation of a differential input buffer that a first input signal A and a second input signal B that are always inverted with respect to each other are provided to the differential input buffer.

TABLE 3

| A (Input) | B (Input) | Y (Output) |
|---|---|---|
| 0 | 1 | 0 |
| 1 | 0 | 1 |
| 0 | 0 | X |
| 1 | 1 | X |

Table 3 is a truth table showing the prerequisite to correct operation of the differential buffer. At partial glance, it seems like the prerequisite can be expressed as Y=A or Y=Not (B). However, when A=B, the value of Y is an undetermined "X".

The truth table contains conditions under which the output signal Y takes an undetermined value "X". Therefore, the prerequisite cannot be represented by a simple logical expression, for example Y=A×B. In some libraries, only simple logical expressions can be used to express their logic models. Accordingly, logics cannot accurately be written. To avoid the problem, logic models are represented as black boxes to implement the logic models as libraries.

Therefore, when a setting is made to fix the logics of the input signals A and B for a block that has a complex logic as illustrated in the example of FIG. 7, a logical expression cannot be written in the library. That is, the logical expression of the output signal Y cannot be fixed in a library.

Figure 8:
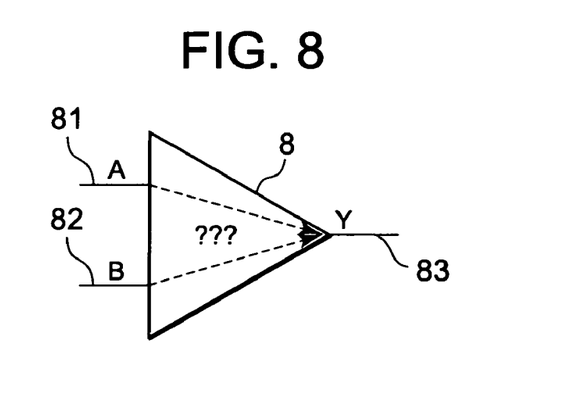
FIG. 8 is a conceptual diagram illustrating that a fixed value cannot be propagated to an output signal Y of a circuit block having a complex logic.

FIG. 8 is a conceptual diagram illustrating that a fixed value cannot be propagated to the output signal Y of a circuit block 8 having a complex logic.

Timing arcs of the differential input buffer in the example in FIG. 7 will be described. A first timing arc relates to the first input signal A and the output signal Y and has the combination of Rise-Rise (the activation condition is "B=0") and Fall-Fall (the activation condition is "B=1"). A second timing arc relates to the second input signal B and the output signal Y and has the combination of Rise-Fall (the activation condition is "A=0") and Fall-Rise (the activation condition is "A=1").

Here, cases will be considered in which the logic value of the first input signal A and the logic value of the second input signal B are fixed.

A first case will be described in which the logics of the first input signal A=0 and the second input signal B=1 are fixed. In this case, the following process is performed.

At step 1, referring to Table 1, it is determined that the first timing arc represents a buffering operation that outputs the first input signal A as the output signal Y without change. Here, it is estimated that output signal Y=0 because the first input signal A is fixed to the logic A=0.

At step 2, referring to Table 1 as in step 1, it is determined that the second timing arc represents an inverter operation that inverts the second output signal B and outputs the inverted signal as the output signal Y. Here, it is estimated that output signal Y=0 because the second input signal B is fixed to the logic B=1.

At step 3, the logic of output signal Y is fixed to Y=0 because it has been estimated that the output signal Y=0 at both steps 1 and 2.

A second case will be described in which the logics of the first input signal A=1 and the second input signal B=1 are fixed. In this case, the following process is performed.

At step 1, referring to Table 1, it is determined that the first timing arc represents a buffering operation that the first input signal A is output as the output signal Y without change. Here, it is estimated that output signal Y=1 because the first input signal A is fixed to the logic A=1.

At step 2, referring to Table 1 as in step 1, it is determined that the second timing arc represents an inverter operation that inverses the second output signal B and outputs the inverted signal as the output signal Y. Here, it is estimated that output signal Y=0 because the second input signal B is fixed to the logic B=1.

At step 3, since the value of the output signal Y estimated at steps 2 differs from the value of the output signal Y estimated at step 1, the activation conditions of both timing arcs are checked.

The logic of the first input signal A=1 is fixed in the first timing arc, which corresponds to the state Rise-Rise. The activation condition for Rise-Rise is "Second input signal B=0". Since the logic of the second input signal B is fixed to B=1 in this case, the activation condition is not satisfied.

The logic of the second input signal B=1 is fixed in the second timing arc, which corresponds to the state Rise-Fall. The activation condition for Rise-Fall is "First input signal A=0". Since the logic of the first input signal A is fixed to A=1 in this case, the activation condition is not satisfied.

The activation conditions for both timing arcs are not satisfied in this case. Accordingly, it is determined that both of the estimates at steps 1 and 2 are invalid. Consequently, the logic of the output signal Y is not fixed.

Processes in the other cases are similar to those described above and therefore detailed description thereof be omitted. Logic values of the output signal Y for each case are summarized in the following table.

TABLE 4

| A (Input) | B (Input) | Y (Output) |
|---|---|---|
| 0 | 1 | 0 |
| 1 | 0 | 1 |
| 0 | 0 | X (Not fixed) |
| 1 | 1 | X (Not fixed) |

Table 4 summarizes the logics of the output signal Y resulting from the circuit verification method of the present invention performed on the logic block in FIG. 7. It can be seen from Table 4 that the same values as those in Table 3 which is an actual truth table have been obtained.

Sixth Exemplary Embodiment

When a logical simulation of a circuit is performed, generally a logic model used can be fairly flexibly described in a library. Therefore, the logic of almost every logic circuit block can be accurately described and a simulation based on the accurate description can be performed.

In contrast, in logic models used in static verification tools and logic synthesis such as logical equivalence verification and STA (Static Timing Analysis), logics of logic circuit blocks often cannot accurately be expressed, depending on operation specifications for the logic circuit blocks. This is because the models can handle only simple logical expressions due to limitations of the functionality of the tools or the specifications for the libraries used.

Logic synthesis and various verifications of logic circuit blocks whose logics cannot accurately be expressed cannot properly be performed if the logics are inaccurately described. Therefore, such logic circuit blocks are written in a library as black boxes having no logic information described.

Figure 9:
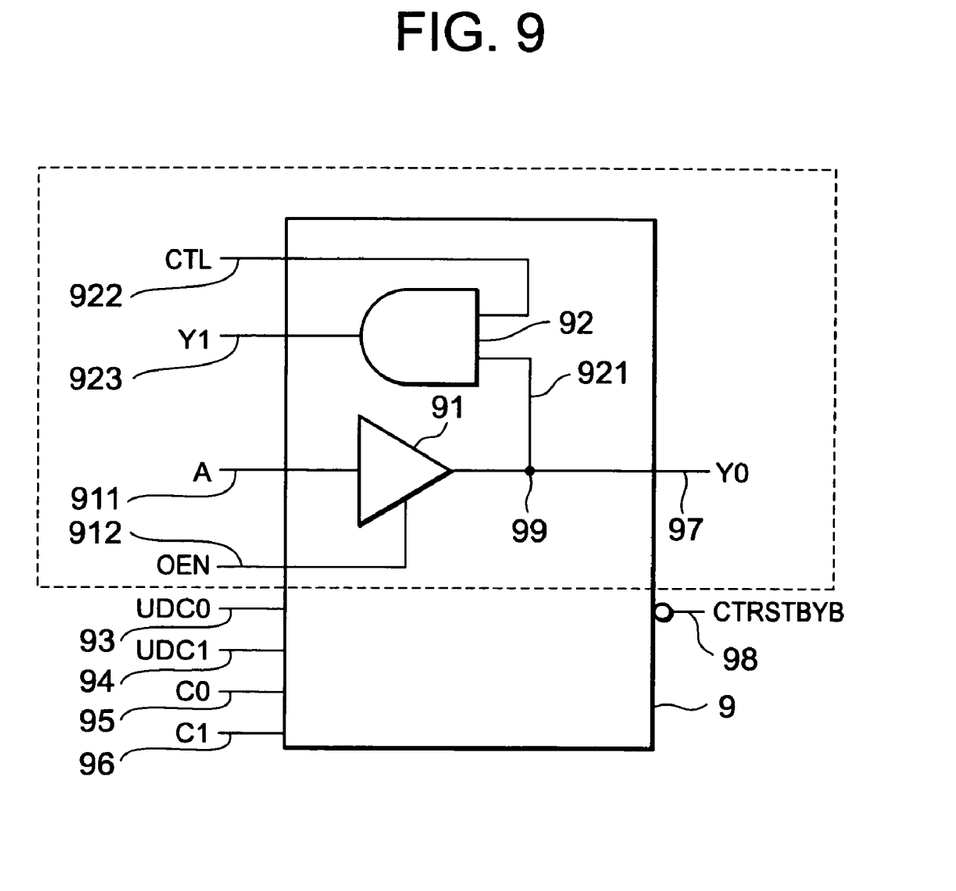
FIG. 9 is a schematic diagram of a logic model of a circuit, used for illustrating a circuit verification method according to a sixth exemplary embodiment of the present invention.

FIG. 9 is a schematic diagram of a logic model 9 of a circuit used for illustrating a circuit verification method according to a sixth exemplary embodiment of the present invention. The logic model 9 depicted in FIG. 9 represents an IO buffer.

The logic model 9 of the IO buffer includes a first logic circuit 91, a second logic circuit 92, a first input 911 (A), a second input 912 (OEN), a third input 922 (CTL), a fourth input 93 (UDC0), a fifth input 94 (UDC1), a sixth input 95 (C0), a seventh input 96 (C1), a first output 97 (Y0), a second output 923 (Y1), and a third output 98 (CTRSTBYB).

The first input 911 is connected to a first input of the first logic circuit 911. The second input 912 is connected to a first input of the first logic circuit 911. The first output 97 is connected to an output 99 of the first logic circuit 911.

The connection 99 of the first logic circuit 91 is connected to a first input 921 of the second logic circuit 92. The third input 922 is connected to a second input of the second logic circuit 92. The second output 923 is connected to an output of the second logic circuit 92.

Accurate logics can be described for the part of the IO buffer 9 enclosed in the dashed box, that is, the part relating to the first logic circuit 91 and the second logic circuit 92. However, simple logical expressions cannot be defined for operations of the inputs and outputs in the other part of the IO buffer 9 outside the dashed box.

For example, the fourth input 93 (UDC0) and the fifth input 94 (UDC1) act as terminals for switching between PU (Pull Up) resistance and PD (Pull Down) resistance of the IO buffer 9.

TABLE 5

| OEN (Input) | UDC1 (Input) | UDC0 (Input) | Y0 (Output) | PU/PD state |
|---|---|---|---|---|
| 0 | 0 | 0 | Hi-Z | No resistance |
| 0 | 0 | 1 | Weak-High | PU 50K |
| 0 | 1 | 0 | Hi-Z | No resistance |
| 0 | 1 | 1 | Weak-Low | PU 50K |

Table 5 is a truth table relating to the fourth input 93 (UDC0) and the fifth input 94 (UDC1).

The truth table in Table 5 can be accurately described in a library for logic simulator. However, accurate logics cannot be described in libraries used in logic synthesis, STA and logical equivalence verification because there is no method for representing the Pull Up and Pull down.

Therefore, for an IO buffer 9 as shown in FIG. 9, a black box library is provided instead of defining the logics in a library.

An example in which the IO buffer 9 in FIG. 9 is used in another circuit will be described next.

Figure 10:
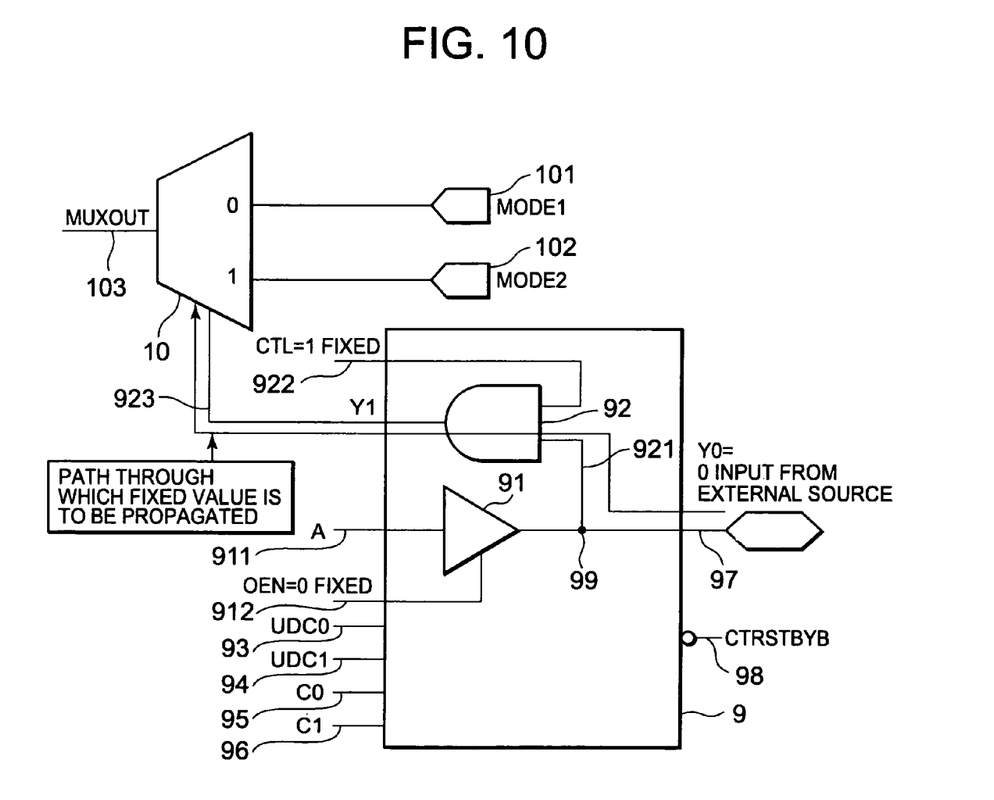
FIG. 10 is a schematic diagram of a logic model of a circuit and a MUX circuit, used for illustrating a circuit verification method according to the sixth exemplary embodiment of the present invention.

FIG. 10 is a schematic diagram of a logic model 9 of a circuit and a MUX circuit 10, used for illustrating the circuit verification method according to the sixth exemplary embodiment of the present invention. The circuit in FIG. 10 is equivalent to the IO buffer 9 connected to the MUX circuit 10.

The MUX circuit 10 includes a first input 101 (MODE1), a second input 102 (MODE2), a third input 923, and an output 103 (MUXOUT).

The second output 923 (Y1) of the IO buffer circuit 9 is connected to the third input 923 of the MUX circuit 10.

The other components and connections of the circuit in FIG. 10 are the same as those in FIG. 9 and therefore detailed description thereof will be omitted.

In the circuit in FIG. 10, an output signal Y1 from the IO buffer 9 controls the MUX circuit 10. The MUX circuit 10 propagates one of the values of the first input signal MODE 1 and the second input signal MODE 2 to the output signal MUXOUT under the control of the output signal Y1.

When "0" is provided as a signal Y0 from an external source to the first output 97 of the circuit in FIG. 10, the value of the signal MODE 1 propagates to the signal MUXOUT. However, if the IO buffer 9 is a black box, the signal Y0 never propagates to the signal Y1. Accordingly, if the signal MODE 1 propagates to the signal MUXOUT, the circuit in FIG. 10 cannot recognize the propagation.

Consequently, for example when the signal MODE 2 is not used, unnecessary verification or logic verification of the signal MODE 2 will be performed, and thereby a false error can be caused.

To prevent the problem, a method is commonly used in which a designer sets a value ("0" in this case) that the designer expects as the signal Y1 from the output 923 of the IO buffer 9. However, if the signal CTL or the signal OEN is fixed to a wrong value or the value of the signal Y0 is changed, then a state that differs from an actual state is set in the IO buffer 9. Consequently, verification not intended by the designer will be performed.

The present invention allows a fixed value to be logically propagated to the signal Y1 of the second output terminal 923 without logic information if there are timing arcs.

The IO buffer circuit 9 has the following four timing arcs. A first timing arc relates to the input signal Y0 and the output signal Y1 and has the combination of Rise-Rise, Fall-Fall, and the activation condition "CTL=1". A second timing arc relates to the input signal CTL and the output signal Y1 and has the combination of Rise-Rise, Fall-Fall, and the activation condition "Y0=1". A third timing arc relates to the input signal A and the output signal Y0 and has the combination of Rise-Rise and Fall-Fall. A fourth timing arc relates to the input signal OEN and the output signal Y0 and has the combination of Rise-ZH, Rise-ZL, Fall-HZ, and Fall-LZ.

The buffer circuit 9 further has the following three constraint conditions. A first constraint condition is "Y0=0". A second constraint condition is "OEN=0". A third constraint condition is "CTL=1".

Steps 1 to 4 of logic propagation will be described. At step 1, it is determined from the fourth timing arc that the enable of the tristate section is turned off when OEN=0, and therefore HiZ is set at the output of the tristate section. Details of the step are the same as described with respect to the third exemplary embodiment and repeated description thereof will be omitted.

At step 2, wird operation of Y0 (=0) and an output (=HiZ) of the tristate section is performed. This operation is not related to the present invention and is arithmetic processing of a tool that is the same as arithmetic processing of the related art. As the logic of the wird section, 0 is obtained.

At step 3, fixed value propagation to Y1 is performed based on the first and second timing arcs as described below.

At sub-step 1 of step 3, the value of Y1 is fixed at 0 from the first timing arc and the first and third constraint conditions.

At sub-step 2 of step 3, the value of Y1 is fixed at 1 from the second timing arc and the third constraint condition.

At sub-step 3 of step 3, the activation conditions are checked because the result of sub-step 2 differs from the result of sub-step 1. Here, the first constraint condition "Y0=0" does not satisfy the activation condition "Y0=1" for the second timing arc. Accordingly, the second timing arc is not activated. On the other hand, the third constraint condition "CTL=1" satisfies the activation condition "CTL=1" for the first timing arc. Accordingly, the first timing arc is activated. Therefore, "0" resulting from sub-step 1 of step 3 is propagated to the output signal Y1. The processing method has been described in detail with respect to the second exemplary embodiment and therefore repeated description thereof will be omitted.

At step 4, "0" is propagated as the selector signal of the MUX circuit 10 because Y1=0.

As has been described, in circuit verification methods of the present invention, a fixed value is propagated by taking into consideration timing information for a black box in addition to logic information. Therefore, the present invention has the following advantageous effects. Because a fixed value required can be propagated in a circuit, unnecessary verification is not performed and therefore false errors are prevented and execution turnaround time is reduced. Furthermore, when a constraint at an input of a black box is changed, fixed value propagation can be performed by taking into consideration the change. Therefore, errors which could be caused by manual operation by a designer can be prevented and the man-hours for redesign can be reduced.

A circuit verification program according to the present invention includes the steps of any of the circuit verification methods described above in such a manner that the steps can be executed on a computer.

Further, it is noted that Applicant's intent is to encompass equivalents of all claim elements, even if amended later during prosecution.

What is claimed is:

1. A circuit verification method executed by a computer, comprising:
   (a) inputting design data relating to a design of a circuit to be verified and a library relating to operation of the circuit to be verified, the library including a logic information concerning the circuit to be verified and a timing information concerning the circuit to be verified;
   (b) setting a fixed logic value for a predetermined node in the circuit to be verified as an initial value;
   (c) tracing the design data from the node for which the fixed logic value is set to select a next-stage circuit block to which the fixed logic value is to be propagated;
   (d) propagating the fixed logic value from an input to an output in the circuit block selected at step (c);
   (e) determining whether or not executable fixed logic value propagation has been completed in all circuit blocks and repeating steps (c) and (d) until the propagation has been completed; and
   (f) if the executable fixed logic value propagation has been completed in all circuit blocks, then executing verification, as performed by a processor on the computer, of the entire circuit to be verified by using results of the fixed logical value propagation performed by a logic information propagating unit and a timing information propagating unit,
   wherein step (d) comprises:
      (d-1) determining whether or not logic information is defined in a library of the circuit block selected at step (c);
      (d-2) if the logic information is defined in the library, then propagating the fixed logic value from an input of the circuit block to an output of the circuit block on a basis of the logic information; and
      (d-3) if the logic information is not defined in the library, then propagating the fixed logic value from the input of the circuit block to the output of the circuit block on a basis of timing information.

2. The circuit verification method according to claim 1, wherein step (d-3) comprises:
- (d-3-1) if the timing information concerning the circuit block selected at step (c) includes only one timing arc which defines a relationship between an input signal and an output signal, then obtaining a fixed logic value of the output signal on the basis of the timing arc and propagating the fixed logic value.

3. The circuit verification method according to claim 1, wherein step (d-3) comprises:
- (d-3-2) if the circuit block selected at step (c) includes a plurality of inputs and the timing information concerning the selected circuit block includes a plurality of timing arcs relating to the plurality of inputs and the output of the selected circuit block, then obtaining a plurality of logic values of the output signal for each timing arc satisfying an activation condition among the plurality of timing arcs and ignoring each timing arc not satisfying the activation condition;
- (d-3-3) for each of the plurality of logic values obtained at step (d-3-2), if the logic value can be fixed to a determined value "0" or "1", then fixing the logic value to the determined value, and if the logic value cannot be fixed to a determined value, then treating the logic value as an undetermined value;
- (d-3-4) if all of the plurality of logic values obtained at step (d-3-3) are identical to any determined value, then propagating the determined value as an output signal of the selected circuit block;
- (d-3-5) if any of the plurality of logic values obtained at step (d-3-3) are undetermined and all of the other logic values are identical to any determined value, then propagating the determined value as the output signal of the selected circuit block;
- (d-3-6) if the plurality of logic values obtained at step (d-3-3) satisfy neither of the condition at step (d-3-4) and the condition at step (d-3-5), then propagating an undetermined value as the output signal of the selected circuit block;
- (d-3-7) if input signals at the circuit block selected at step (c) include an undetermined value, then obtaining, for all combinations of instances where the undetermined value is a determined value "0" and where the undetermined value is a determined value "1", logic values that are propagated as the output signal of the selected circuit block when steps (d-3-4) through (d-3-6) are executed;
- (d-3-8) if all of the logic values obtained at step (d-3-7) are identical to any determined value, then propagating the determined value as the output signal of the selected circuit block; and
- (d-3-9) if the logic values obtained at step (d-3-7) are not identical, then propagating an undetermined value as the output signal of the selected circuit block.

4. The circuit verification method according to claim 1, wherein step (d-3) comprises:
- (d-3-10) if a timing arc of the circuit block selected at step (c) includes a high impedance state, then treating an input signal of the timing arc including the high impedance state as an enable signal for a tristate buffer;
- (d-3-11) if the logic value of the input signal at step (d-3-10) is fixed to a side on which the logic value transitions from a high impedance state to a determined value, then determining that the enable signal for the tristate buffer is in the On state and performing fixed value propagation through another timing arc;
- (d-3-12) if the logic value of the input signal at step (d-3-10) is fixed to a side on which the logic value transitions from a determined value to the high impedance state, then determining that the enable signal for the tristate buffer is in the Off state and placing the output signal of the timing arc in the high impedance state; and
- (d-3-13) if the logic value of the input signal at step (d-3-10) satisfies neither of the conditions in steps (d-3-11) and (d-3-12), then propagating the output signal as an undetermined state.

5. The circuit verification method according to claim 1, wherein step (d-3) comprises:
- (d-3-14) if all of the timing arcs of the circuit block selected at step (c) relates to an input signal having a clock attribute, then propagating an undetermined value as the output signal of the circuit block;
- (d-3-15) if the timing arcs of the circuit block selected at step (c) include a timing arc relating to an input signal having a clock attribute and a timing arc relating to asynchronous set/reset, then propagating a fixed value obtained through the timing arc relating to asynchronous set/reset as the output signal of the circuit block; and
- (d-3-16) if the timing arcs of the circuit block selected at step (c) include a timing arc relating to an input signal having a clock attribute and a timing arc relating to an input signal not relating to asynchronous set/reset and the value of the input signal having the clock attribute is fixed in a direction in which a transition occurs due to a clock, then propagating a fixed value obtained through the timing arc relating to the input signal not relating to the asynchronous set/reset as the output signal of the circuit block.

6. A circuit verification apparatus, comprising:
- an input unit which receives design data relating to a design of a circuit to be verified and a library relating to operation of the circuit to be verified;
- a design storage which stores the design data;
- a logic information storage which stores a logic information concerning the circuit to be verified, the logic information being contained in the library;
- a timing information storage which stores a timing information concerning the circuit to be verified, the timing information being contained in the library;
- a fixed logic value setting unit which sets a fixed logic value as an initial value for a predetermined node in the circuit to be verified;
- a next-stage circuit block selecting unit which traces the design data from the node for which the fixed logic value is set to select a next-stage circuit block to which the fixed logic value is to be propagated;
- a library checking unit which determines whether or not logic information is defined in the library of the circuit block selected by the next-stage circuit block selecting unit;
- a logic information propagating unit which propagates a fixed logic value from an input of the circuit block to an output of the circuit block on a basis of the logic information if the logic information is defined in the library;
- a timing information propagating unit which propagates a logic value from an input of the circuit block to an output of the circuit block on a basis of the timing information if the logic information is not defined in the library;
- a propagation completion determining unit which determines whether or not executable fixed logic value propagation has been completed in all circuit blocks; and
- a verification executing unit which executes verification of the entire circuit to be verified by using results of propagation of the fixed logic value performed by the logic information propagating unit and the timing information propagating unit when the executable fixed logic value propagation has been completed in all circuit blocks.

7. The circuit verification apparatus according to claim 6, further comprising:

a program storage which stores a circuit verification program; and an output unit which outputs a result of verification performed by the verification executing unit.

8. A circuit verification non-transitory program storage comprising the steps of the circuit verification method according to claim 1 in a computer-executable manner.

* * * * *